(12) United States Patent
Nahas et al.

(10) Patent No.: US 6,700,814 B1
(45) Date of Patent: Mar. 2, 2004

(54) SENSE AMPLIFIER BIAS CIRCUIT FOR A MEMORY HAVING AT LEAST TWO DISTINCT RESISTANCE STATES

(75) Inventors: Joseph J. Nahas, Austin, TX (US); Thomas W. Andre, Austin, TX (US); Bradley J. Garni, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 45 days.

(21) Appl. No.: 10/283,622

(22) Filed: Oct. 30, 2002

(51) Int. Cl.[7] ............................................. G11C 11/00
(52) U.S. Cl. .................... 365/158; 365/210; 365/207
(58) Field of Search ................................. 365/158, 205, 365/207, 209, 210

(56) References Cited

U.S. PATENT DOCUMENTS

| | | |
|---|---|---|
| 6,191,989 B1 | 2/2001 | Luk et al. |
| 6,256,247 B1 | 7/2001 | Perner |
| 6,269,040 B1 | 7/2001 | Reohr et al. |
| 6,501,697 B1 * | 12/2002 | Perner et al. ................ 365/210 |
| 6,525,978 B2 * | 2/2003 | Weber et al. ................ 365/207 |
| 6,597,601 B2 * | 7/2003 | Ooishi ......................... 365/158 |

* cited by examiner

*Primary Examiner*—Huan Hoang
(74) *Attorney, Agent, or Firm*—Robert L. King; James L. Clingan

(57) ABSTRACT

In a memory, a bias circuit (112, 212, 312, 412) uses a current reference (108) for providing a reference current and control circuitry (106, 120) to bias a sense amplifier (114) with a varying voltage ($V_B$). The varying voltage maintains current through MRAM bit cells (177–179) at a value proportional to the reference current over variations in average bit cell resistance with immunity to variations in process, supply voltage and temperature. In one form, a mock sense amplifier (122, 126, 132, 134) and mock array of bit cells (130, 136) are used to establish internal steady state voltages equivalent to a steady state condition of the sense amplifier with equalized outputs and to generate the varying bias voltage. Matching diode-connected transistors in each of the control circuitry and either the mock sense amplifier or the sense amplifier is used to generate the varying bias voltage.

16 Claims, 4 Drawing Sheets

SENSE AMPLIFIER BIAS CIRCUIT FOR A MEMORY HAVING AT LEAST TWO DISTINCT RESISTANCE STATES

CROSS REFERENCE TO RELATED APPLICATION

This application is related to U.S. patent application Ser. No. 10/184,784, entitled "Sense Amplifier For A Memory Having At Least Two Distinct Resistance States" filed Jun. 28, 2002, and assigned to the assignee hereof.

FIELD OF THE INVENTION

This invention relates to Magnetoresistive Random Access Memories (MRAMs) and other memories where the memory bit has at least two distinct resistance states, and more particularly to the sensing circuitry for such memories.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, other types of nonvolatile memories are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

The resistance of the tunnel junction (TJ) changes value depending on the state of polarization of the magnetic layers above and below the tunnel junction. The resistance changes from a lower resistance value when the magnetic fields are aligned in the same direction to a higher resistance value when they are aligned in opposite directions. The value change may be on the order of thirty percent. Therefore, for a low resistance value of 10K ohms, the high resistance value could be about 13K ohms. A sense amplifier for an MRAM needs to detect this difference in value. Because of processing variation in the thickness of the oxide in the tunnel junction, there is a large distribution of resistance values between wafer lots of MRAM circuits. Since the nominal value of the resistance within a wafer also varies, it is useful to detect the state of a bit by comparing the resistance of the tunnel junction in a bit to a nearby midpoint reference that may be formed as a midpoint of a reference bit in the high state and a reference bit in the low state. It is also important to maintain symmetry to balance the loading from the parasitic resistance and capacitance of the bit lines and the column multiplexing.

Many MRAM sense amplifiers use a fixed voltage on a common gate stage to place a fixed voltage across the MRAM cell. Control or voltage reference circuits for such sense amplifiers generate a fixed voltage for the gate of the common gate stage. With large processing variations in the MRAM cell resistance and a fixed voltage across the cell, the MRAM cell provides large variations in current to the sense amplifier, making optimization of the sense amplifier difficult. By using a fixed voltage for the gate of a common gate stage, the voltage on the bit line and consequently across the memory cell is a constant value independent of the resistance of the bit. The current change resulting from bit resistance changing from processing lot-to-lot causes inaccuracies with device matching in the sense amplifier, thereby degrading sensing time and accuracy.

BRIEF DESCRIPTION OF THE DRAWINGS

The foregoing and further and more specific objects and advantages of the instant invention will become readily apparent to those skilled in the art from the following detailed description of the invention taken in conjunction with the following drawings.

DETAILED DESCRIPTION OF THE INVENTION

Figure 1:
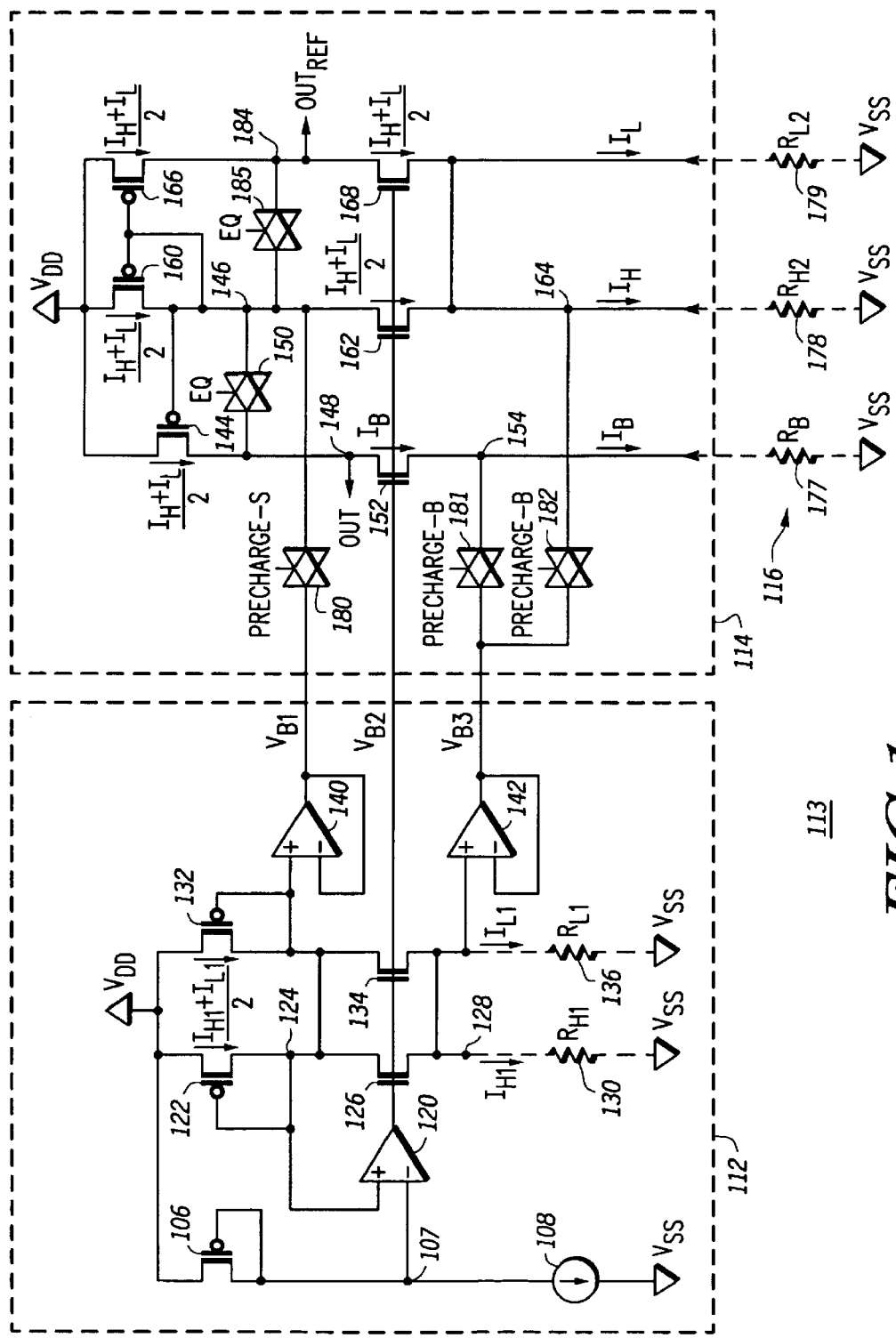
FIG. 1 is a schematic diagram of a bias circuit for voltage control of a sense amplifier.

Illustrated in FIG. 1 is a memory 113 generally having a bias circuit 112, a sense amplifier 114 and an array portion 116. The bias circuit 112 has a P-channel transistor 122 having a first current electrode or a source connected to a power supply voltage terminal $V_{DD}$. A control electrode or gate of transistor 122 is connected to a second current electrode or a drain thereof at a node 124. An N-channel transistor 126 has a drain connected to the drain of transistor 122, a gate connected to the output of an operational amplifier 120, and a source connected to a node 128. Operational amplifier 120 has a first or positive (non-inverting) input connected to node 124 at the drain and gate of transistor 122. A second or negative (inverting) input of operational amplifier 120 is connected to a node 107. A first terminal of a resistance 130, $R_{H1}$, is coupled to node 128. A second terminal of resistance 130 is coupled to a $V_{SS}$ reference voltage terminal. A P-channel transistor 132 has a source connected to the $V_{DD}$ terminal, and a gate and a drain connected together and to node 124 and to a drain of an N-channel transistor 134. Transistor 134 has a gate connected to the output of operational amplifier 120 and has a source connected to node 128 and coupled to a first terminal of a resistance 136, $R_{L1}$. A second terminal of resistance 136 is coupled to the $V_{SS}$ terminal. The connections to resistance 130 and resistance 136 may include coupling devices (not shown) to match the connections of array resistances 177–179 of array portion 116 to be described below. An operational amplifier 140 has a positive input connected to node 124, and a negative input connected to an output thereof for providing a sense precharge voltage, $V_{B1}$. An operational amplifier 142 has a positive input connected to node 128, and a negative input connected to an output thereof for providing a bit precharge voltage, $V_{B3}$. The output of operational amplifier 120 provides a common gate bias voltage, $V_{B2}$. A P-channel transistor 106 has a source connected to the $V_{DD}$ terminal, and a gate and drain connected together in a diode-connected configuration and to a node 107 at a negative or inverting input of operational amplifier 120. A current source 108 has a first terminal connected to node 107 and a second terminal connected to the $V_{SS}$ terminal.

In the sense amplifier 114, a P-channel transistor 144 has a source connected to the $V_{DD}$ voltage terminal. A drain of transistor 144 is connected to a drain of an N-channel transistor 152 at an output node 148 which forms an output terminal labeled OUT. A gate of transistor 152 is connected to the $V_{B2}$ common gate bias voltage. A source of transistor 152 is connected to a node 154 and coupled via one or more coupling devices (not shown) to a first terminal of a bit resistance 177 having a resistance of $R_B$. A second terminal of bit resistance 177 is coupled via one or more coupling devices (not shown) to the $V_{SS}$ voltage terminal. A P-channel transistor 160 has a source connected to the $V_{DD}$ voltage terminal, and a gate connected to a drain thereof and to a gate of transistor 144. A switch 150 has a first terminal connected to the drain of transistor 144 at node 148 and a second terminal connected to the drain of transistor 160 at node 146. Switch 150 is controlled by an Equalization control signal, EQ. A drain of an N-channel transistor 162 is connected to node 146. Transistor 162 has a gate connected to the $V_{B2}$ common gate bias voltage and has a source connected to a node 164. A first terminal of a high reference resistance 178, $R_{H2}$, is coupled via one or more coupling devices (not shown) to a node 164. A second terminal of resistance 178 is coupled via one or more coupling devices (not shown) to the $V_{SS}$ voltage terminal. A P-channel transistor 166 has a source connected to the $V_{DD}$ voltage terminal. A gate of transistor 166 is connected to node 146 and to the gate of transistor 160. A drain of transistor 166 is connected to node 184 that forms a reference output terminal, $OUT_{REF}$. A switch 185 has a first terminal connected to node 146 and a second terminal connected to the drain of transistor 166 at a node 184. A control terminal of switch 185 receives the equalization control signal, EQ. A drain of an N-channel transistor 168 is connected to node 184. Transistor 168 has a gate connected to the bias voltage, $V_{B2}$. A source of transistor 168 is connected to the source of transistor 162 at node 164 and is coupled via one or more coupling devices (not shown) to a first terminal of a low reference resistance 179, $R_{L2}$. A second terminal of resistance 179 is coupled via one or more coupling devices (not shown) to the $V_{SS}$ voltage terminal. A switch 180 has a first terminal connected to the output of operational amplifier 140. Switch 180 has a second terminal connected to 20 node 146, and has a control terminal connected to a precharge control signal, PRECHARGE-S. A switch 181 has a first terminal connected to the output of operational amplifier 142, a second terminal connected to node 154 and a control terminal for receiving a precharge control signal, PRECHARGE-B. A switch 182 has a first terminal connected to the output of operational amplifier 142, a second terminal connected to node 164, and a control terminal for receiving the PRECHARGE-B signal. Resistances 177–179 form the array portion 116. Within bias circuit 112, transistor 106 and operational amplifier 120 form control circuitry, resistances 130 and 136 form a mock sense array of bit cells, and transistors 122, 126, 132 and 134 form a mock sense amplifier. The mock sense amplifier and array of bit cells simulate and track the same operational characteristics as sense amplifier 114 and array portion 116, respectively.

In operation, bias circuit 112 generates three specific bias voltages to control sense amplifier 114. Sense amplifier 114 uses a common gate voltage, $V_{B2}$, to bias the transistors 152, 162 and 168. The biasing of transistors 152, 162 and 168 places a substantially same bias voltage across resistances $R_B$, $R_{H2}$ and $R_{L2}$ that is close to a transistor threshold below $V_{B2}$. This biasing establishes current levels for each resistance that is represented as $I_B$, $I_H$ and $I_L$ and saturated current levels for each of transistors 152, 162 and 168 that is represented as $I_B$, $[(I_H+I_L)/2]$ and $[(I_H+I_L)/2]$, respectively. The values of $I_B$, $I_H$ and $I_L$ are substantially the voltage at node 154 divided by $R_B$, the voltage at node 164 divided by $R_{H2}$, and the voltage at node 164 divided by $R_{L2}$, respectively.

However, the resistive values of each of $R_B$, $R_{H2}$ and $R_{L2}$ are subject to process variation. For a given $V_{B2}$ voltage, variations in the resistances of $R_B$, $R_{H2}$ and $R_{L2}$ will proportionately change the current values $I_B$, $I_H$ and $I_L$.

Within sense amplifier 114, the sources of transistors 162 and 168 are connected in a manner that averages $I_H$ and $I_L$ thereby establishing a current through transistor 160 equal to $(I_H+I_L)/(2)$. Connecting the gates of transistors 144 and 166 at node 146 to the gate of transistor 160 establishes as a current mirror saturated current levels for transistors 144 and 166 that are also equal to $(I_H+I_L)/(2)$. The biasing of transistor 166 establishes a reference voltage $OUT_{REF}$ at node 184. The voltage at node 148, the output (OUT), will then reflect the difference between the saturated current $(I_H+I_L)/(2)$ conducted by transistor 144 and the saturated current $I_B$ conducted by transistor 152. For an $R_B$ with a low resistance state, the steady state voltage value of the Out signal at node 148 will be lower in potential than the reference voltage $OUT_{REF}$. For an $R_B$ with a high resistance state, the steady state voltage value of the Out signal at node 148 will be higher in potential than the reference voltage $OUT_{REF}$.

Due to process variation, transistors 144, 160 and 166 will have slightly different threshold voltages. This mismatch impacts the accuracy of the sense amplifier 114 by effectively adding an offset between the nominally $(I_H+I_L)/(2)$ currents in transistors 144, 160 and 166. The magnitude of the currents $I_H$ and $I_L$ impacts this mismatch by changing the gate-to-source voltage bias across transistors 144, 160 and 166, thereby changing the offset introduced by small changes in the value of $(V_{gs}-Vt)^2$ for the transistors 144, 160 and 166. Within the operating range of a given sense amplifier, larger values of the quantity $(V_{gs}-Vt)^2$ associated with transistors 144, 160 and 166, which result from larger current values for $I_B$, $I_H$ and $I_L$, reduces the mismatch between transistors 144, 160 and 166. Therefore, controlling the currents $I_B$, $I_H$ and $I_L$ over process, supply voltage and temperature variations, rather than maintaining a fixed voltage for $V_{B2}$, improves the accuracy of the sense amplifier 114 through the range of these variations.

To accurately control the value of $V_{B2}$ to maintain a constant value for currents $I_B$, $I_H$ and $I_L$, bias circuit 112 uses a current reference and circuitry to mock the sense amplifier 114 and array 116. Assume that transistors 106, 122 and 132 are matched in size to have substantially the same threshold voltage. Therefore, when current reference 108 is applied across diode-connected transistor 106, a voltage at node 107 is produced which when maintained at node 124 provides currents through transistors 122 and 132 that are substantially equal to the current of current source 108. By using feedback from node 124 and control of the currents through transistors 126 and 134, operational amplifier 120 maintains substantially the same voltage at nodes 107 and 124. In this manner, operational amplifier 120 in conjunction with the mock sense amplifier creates a servo loop. As a result of the servo loop the $V_{B2}$ voltage is maintained at a level that provides an average current $[(I_{H1}+I_{L1})/2]$ through transistors 126 and 134 that is substantially the same as the current sourced by current source 108 where $I_{H1}$ and $I_{L1}$ are the currents through resistors $R_{H1}$ and $R_{L1}$, respectively. Therefore, assuming: (1) transistors 126, 134, 152, 162 and 168 are all matched to have substantially the same threshold voltage; (2) $R_{H1}$ and $R_{L1}$ are representative of high and low resistance values seen on $R_B$, $R_{H2}$ and $R_{L2}$; and (3) the interconnect routing to resistors $R_{H1}$ and $R_{L1}$ is equivalent to the routing to resistances $R_B$, $R_{H2}$ and $R_{L2}$; then currents $I_B$, $I_H$ and $I_L$ will be maintained to have a similar magnitude as the current of current reference 108. By matching transistors 106, 122 and 132 to transistors 144, 160 and 166, drain-to-source biases of transistors 126 and 134 in the mock sense amplifier will better match those of transistors 152, 162 and 168 in sense amplifier 114 and the current matching described above is improved.

Equalization switches 150 and 185 in sense amplifier 114 can be used to reduce the impact of capacitive imbalance on the sense amplifier speed by allowing the voltages at nodes 154 and 164 to settle closer to a steady state value before voltage movement on nodes 148 and 184 occurs. Therefore, the timing of the EQ control signal is established to be asserted only during a time when the sense amplifier's output is not expected to be valid. It should however be well understood that the use of equalization switches 150 and 185 is not an essential component of sense amplifier 114.

By using transistors 122 and 132 substantially of the same size as transistors 144, 160 and 166, operational amplifier 140 provides a voltage $V_{B1}$ that is used to precharge nodes 148, 146 and 184 in sense amplifier 114 to a value close to their steady state value. By also using transistors 120 and 134 substantially of the same size as transistors 152, 162 and 168, operational amplifier 142 provides a voltage $V_{B3}$ that is used to precharge nodes 154 and 164 to a value close to their steady state values. The PRECHARGE-S and PRECHARGE-B control signals are asserted simultaneously, in a preferred form, and during a precharge time period prior to a valid sensing time period. Use of these precharge voltages $V_{B1}$ and $V_{B3}$ increases the sense amplifier speed by bringing the nodes of sense amplifier 114 to their steady state condition in a quicker manner. It should also be understood that the use of $V_{B1}$ and $V_{B3}$ is not an essential component of sense amplifier 114.

Bias circuit 112 is designed to adjust the voltages $V_{B1}$, $V_{B2}$ and $V_{B3}$ over temperature, supply voltage, and process variations. The tracking in voltage values between bias circuit 112 and sense amplifier 114 is in part due to the intentional device size matching of transistors in voltage bias portion 112 with transistors in sense amplifier 114 and use of reference resistances $R_{H1}$ and $R_{L1}$.

Figure 2:
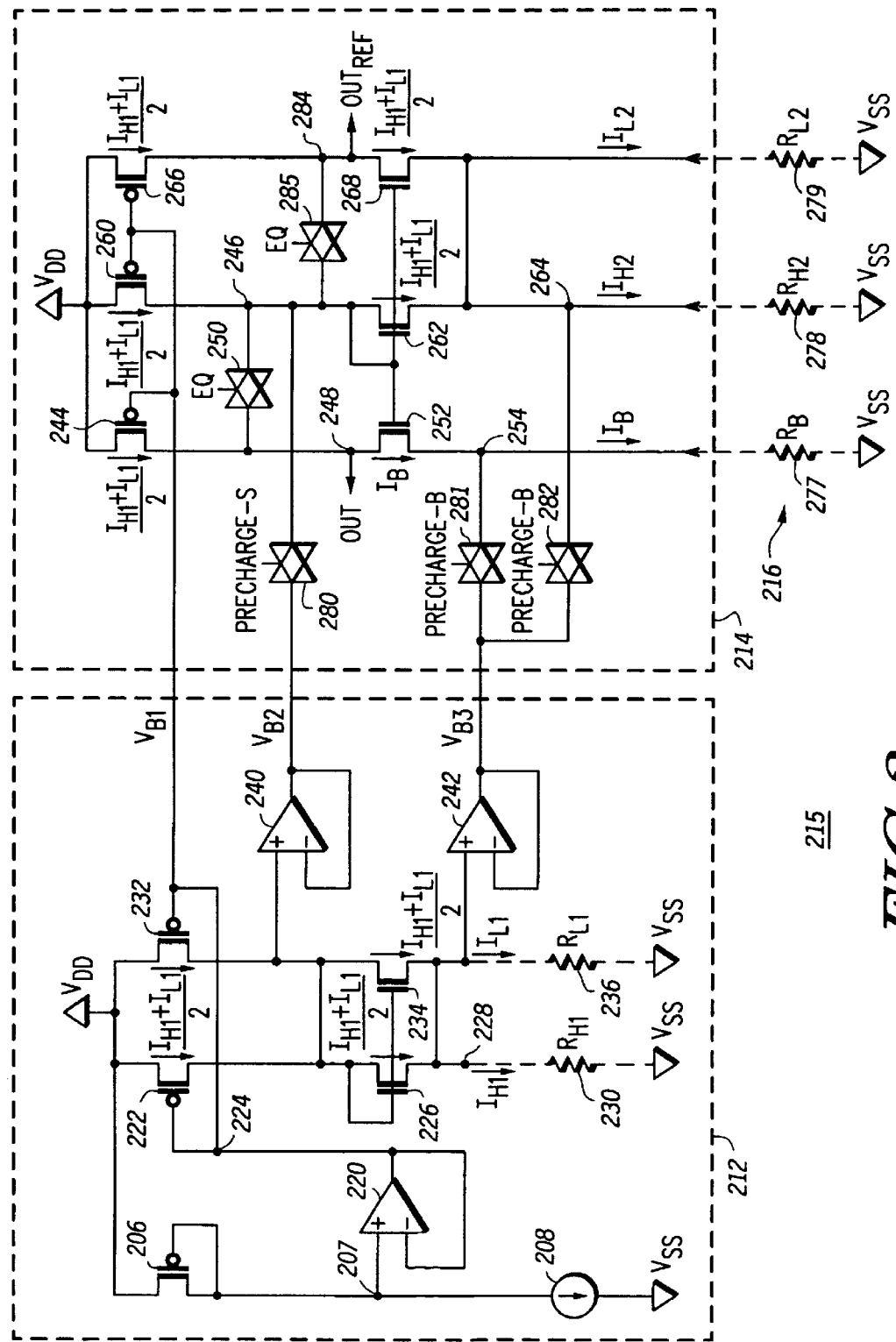
FIG. 2 is a schematic diagram of a bias circuit for voltage control of another sense amplifier.

Illustrated in FIG. 2 is a memory 215 that is a variation of memory 113 of FIG. 1. Memory 215 generally has a bias circuit 212, a sense amplifier 214 and an array portion 216. The bias circuit 212 has a P-channel transistor 222 having a first current electrode or a source connected to a power supply voltage terminal $V_{DD}$. A control electrode or gate of transistor 222 is connected to a node 224 to both an output and a first or negative (inverting) input of an operational amplifier 220. An N-channel transistor 226 has a drain connected to its gate and to a drain of transistor 222, and a source connected to a node 228. Operational amplifier 220 has a second or positive (non-inverting) input connected to a node 207. A first terminal of a resistance 230, $R_{H1}$, is coupled to node 228. A second terminal of resistance 230 is coupled to a $V_{SS}$ reference voltage terminal. A P-channel transistor 232 has a source connected to the $V_{DD}$ terminal, a gate connected to node 224, and a drain connected to a drain of an N-channel transistor 234. Transistor 234 has a gate connected to the gate of transistor 226 and has a source coupled to a first terminal of a resistance 236, $R_{L1}$. A second terminal of resistance 236 is coupled to the $V_{SS}$ terminal. As with memory 113, the connection to resistance 230 and resistance 236 may include coupling devices (not shown) to match the connections of array resistances 277–279 of array portion 216 to be described below. An operational amplifier 240 has a positive input connected to node 224, and a negative input connected to an output thereof for providing a bit precharge voltage, $V_{B2}$. An operational amplifier 242 has a positive input connected to node 228, and a negative input connected to an output thereof for providing a bit precharge voltage, $VB_3$. The output of operational amplifier 220 provides a bias voltage, $V_{B1}$. A P-channel transistor 206 has a source connected to the $V_{DD}$ terminal, and a gate and drain connected together in a diode-connected configuration to node 207 at the noninverting input of operational amplifier 220. A current source 208 has a first terminal connected to node 207 and a second terminal coupled to the $V_{SS}$ terminal.

In the sense amplifier 214, a P-channel transistor 244 has a source connected to the $V_{DD}$ voltage terminal and a gate connected to node 224 for receiving $V_{B1}$. A drain of transistor 244 is connected to a drain of an N-channel transistor 252 at an output node 248 that forms an output terminal labeled OUT. A gate of transistor 252 is connected to the gate of an N-channel transistor 262. A source of transistor 252 is connected to a node 254 and coupled via one or more coupling devices (not shown) to a first terminal of a bit resistance 277, $R_B$. A second terminal of bit resistance 277 is coupled via one or more coupling devices (not shown) to the $V_{SS}$ voltage terminal. A P-channel transistor 260 has a source connected to the $V_{DD}$ voltage terminal, a gate connected to node 224 for receiving $V_{B1}$, and a drain connected to node 246. A switch 250 has a first terminal connected to the drain of transistor 244 and a second terminal connected to the drain of transistor 260 at node 246. Switch 250 is controlled by an Equalization control signal, EQ. A drain of an N-channel transistor 262 is connected to node 246. Transistor 262 has a gate connected to its drain and has a source connected to a node 264. A first terminal of a high reference resistance 278, $R_{H2}$, is coupled via one or more coupling devices (not shown) to node 264. A second terminal of resistance 278 is coupled via one or more coupling devices (not shown) to the $V_{SS}$ voltage terminal. A P-channel transistor 266 has a source connected to the $V_{DD}$ voltage terminal. A gate of transistor 266 is connected to the gates of transistors 260, 244, 232 and 222 at node 224 and to the output of operational amplifier 220 for receiving $V_{B1}$. A drain of transistor 266 is connected to a node 284 that forms a reference output terminal, $OUT_{REF}$. A switch 285 has a first terminal connected to node 246 and a second terminal connected to the drain of transistor 266 at a node 284. A control terminal of switch 285 receives the equalization control signal, EQ. A drain of an N-channel transistor 268 is connected to node 284. Transistor 268 has a gate connected to the gates of transistors 252 and 262. A source of transistor 268 is connected to the source of transistor 262 at a node 264 and is coupled via one or more coupling devices (not shown) to a first terminal of a low reference resistance 279, $R_{L2}$. A second terminal of resistance 279 is coupled via one or more coupling devices (not shown) to the $V_{SS}$ voltage terminal. A switch 280 has a first terminal connected to the output of operational amplifier 240 for receiving $V_{B2}$. Switch 280 has a second terminal connected to node 246, and has a control terminal connected to a precharge control signal, PRECHARGE-S. A switch 281 has a first terminal connected to the output of operational amplifier 242 $V_{B3}$, a second terminal connected to node 254 and a control terminal for receiving a precharge control signal, PRECHARGE-B. A switch 282 has a first terminal connected to the output of operational amplifier 242 $V_{B3}$, a second terminal connected to node 264, and a control terminal for receiving the PRECHARGE-B signal. Resistances 277–279 form the array portion 216. Within bias circuit 212, transistor 206 and current source 208 set up a bias circuit buffered by operational amplifier 220, resistances 230 and 236 form a mock sense array of bit cells, and transistors 222, 226, 232 and 234 form a mock sense amplifier. The mock sense amplifier and array of bit cells simulate and track the same operational characteristics as sense amplifier 214 and array portion 216, respectively. Operational amplifiers 240 and 242 buffer precharge voltages $V_{B2}$ and $V_{B3}$, respectively.

Memory 215 differs from memory 113 in several respects. With respect to the sense amplifiers, sense amplifier 114 uses $V_{B2}$ to establish a reference voltage across bit cells $R_B$, $R_{H2}$ and $R_{L2}$ and uses PMOS transistors 144, 160 and 166 in a mirror configuration. Whereas sense amplifier 214 uses $V_{B1}$ to establish a reference current across bit cells $R_B$, $R_{H2}$ and $R_{L2}$ and uses NMOS transistors 252, 262 and 268 in a. mirror configuration. With respect to the bias circuits, bias circuit 112 regulates $V_{B2}$ to maintain a current level through $R_{H1}$ and $R_{L1}$ proportional to current reference 108. In contrast, bias circuit 212 regulates voltage $V_{B1}$ to maintain a current level through resistances $R_{H1}$ and $R_{L1}$ proportional to current reference 108.

In operation, bias circuit 212 generates three specific bias voltages for sense amplifier 214. Voltage $V_{B1}$ controls sense amplifier 214 and voltages $V_{B2}$ and $VB_3$ are precharge voltages. Sense amplifier 214 applies voltage $V_{B1}$ to the gates of transistors 244, 260 and 266 establishing a saturated current level for these transistors represented as $[(I_{H1}+I_{L1})/2]$. The relationship between the applied voltage $V_{B1}$ and the resulting current $[(I_{H1}+I_{L1})/2]$ varies with changes in process conditions, supply voltage and temperature. Current $[(I_{H1}+I_{L1})/2]$ flows through transistors 262 and 268 where it is summed at node 264 and applied across $R_{H2}$ and $R_{L2}$ as $I_{H2}$ and $I_{L2}$, respectively. This results in a voltage at node 246 which when applied to the gate of transistor 252 biases resistor 277 to a voltage substantially equal to the voltage across resistors 278 and 279. The saturated current level of transistor 252 represented as $I_B$ is defined by the voltage across resistor 278 divided by $R_B$. While equalization switches 250 and 285 are conductive, a steady state voltage is established at nodes 248 and 284. After making equalization switches 250 and 285 nonconductive, node 248, the OUT signal, moves relative to node 284, the $OUT_{REF}$ signal in response to the difference between saturated current level $[(I_{H1}+I_{L1})/2]$ of transistors 244, 266 and 268 and saturated current level $I_B$ of transistor 252.

Due to process variation, transistors 244, 260 and 266 will have slightly different threshold voltages. This mismatch impacts the accuracy of the sense amplifier 214 by effectively adding an offset between the nominally $(I_{H1}+I_{L1})/(2)$ currents in transistors 244, 260 and 266. The magnitude of the currents $I_H$ and $I_L$ impacts this mismatch by changing the gate-to-source voltage bias across transistors 244, 260 and 266, thereby changing the offset introduced by small changes in the value of $(V_{gs}-Vt)^2$ for the transistors 244, 260 and 266. Within the operating range of a given sense amplifier, larger values of the quantity $(V_{gs}-Vt)^2$ associated with transistors 244, 260 and 266, which result from larger current values for $I_B$, $I_H$ and $I_L$, provide less mismatch between transistors 244, 260 and 266. Therefore, controlling the currents $I_B$, $I_H$ and $I_L$ over process, supply voltage and temperature variations by adjusting the value of voltage $V_{B1}$ over the range of these variations improves the accuracy of the sense amplifier 214.

To accurately control the value of $V_{B1}$ in order to maintain a constant value for currents $I_B$, $I_{H2}$ and $I_{L2}$, bias circuit 212 uses a current reference and circuitry to mock the sense amplifier 214 and array 216. Assume that transistors 206, 222 and 232 are matched in size to have substantially the same threshold voltage. Therefore, when current reference 208 is applied across diode-connected transistor 206, a voltage at node 207 is produced which when maintained at node 224 provides currents through transistors 222 and 232 that are substantially equal to the current of current source 208. By using feedback from node 224, operational amplifier 220 maintains substantially the same voltage at nodes 207 and 224. As a result, the $V_{B1}$ voltage is maintained at a level that provides substantially the same average current $[(I_{H1}+I_{L1})/2]$ through transistors 226 and 234 as sourced by current source 208 where $I_{H1}$ and $I_{L1}$ are the currents through resistors $R_{H1}$ and $R_{L1}$, respectively. Therefore, assuming: (1) transistors 222, 232, 244, 260 and 266 are all matched to have substantially the same threshold voltage; (2) $R_{H1}$ and $R_{L1}$ are representative of high and low resistance values seen on $R_B$, $R_{H2}$ and $R_{L2}$; and (3) the interconnect routing to resistors $R_{H1}$ and $R_{L1}$ is equivalent to that to resistances $R_B$, $R_{H2}$ and $R_{L2}$; then currents $I_B$, $I_{H2}$ and $I_{L2}$ will be maintained to have a similar magnitude as the current of current reference 208. By matching transistors 226 and 234 to transistors 252, 262 and 268, drain-to-source biases of transistors 222 and 232 in the mock sense amplifier will better match those of transistors 244, 260 and 266 in sense amplifier 214 and the current matching described above is improved.

Equalization switches 250 and 285 in sense amplifier 214 function in an analogous manner as the equalization switches of sense amplifier 114 of FIG. 1. In other words, the equalization switches reduce the impact of capacitive imbalance on the sense amplifier speed by allowing the voltages at nodes 254 and 264 to settle closer to a steady state value before voltage movement on nodes 248 and 284 occurs.

The voltage $V_{B3}$ provided by operational amplifier 242 is used to precharge nodes 254 and 264 to a value close to their steady state values. By using transistors 226 and 234 substantially of the same size as transistors 252, 262 and 268, operational amplifier 240 provides a voltage $V_{B2}$ that is used to precharge nodes 248, 246 and 284 in sense amplifier 214 to a value close to their steady state value. Use of these precharge voltages $V_{B2}$ and $V_{B3}$ increases the sense amplifier speed by bringing the nodes of sense amplifier 214 to their steady state condition in a quicker manner. It should also be understood that the use of $V_{B2}$ and $V_{B3}$ is not an essential component of sense amplifier 214.

Bias circuit 212 is designed to adjust the voltages $V_{B1}$, $V_{B2}$ and $V_{B3}$ over temperature, supply voltage, and process variations. The tracking in voltage values between bias circuit 212 and sense amplifier 214 is in part due to the intentional device size matching of transistors in voltage bias portion 212 with transistors in sense amplifier 214 and use of reference resistances $R_{H1}$ and $R_{L1}$.

Figure 3:
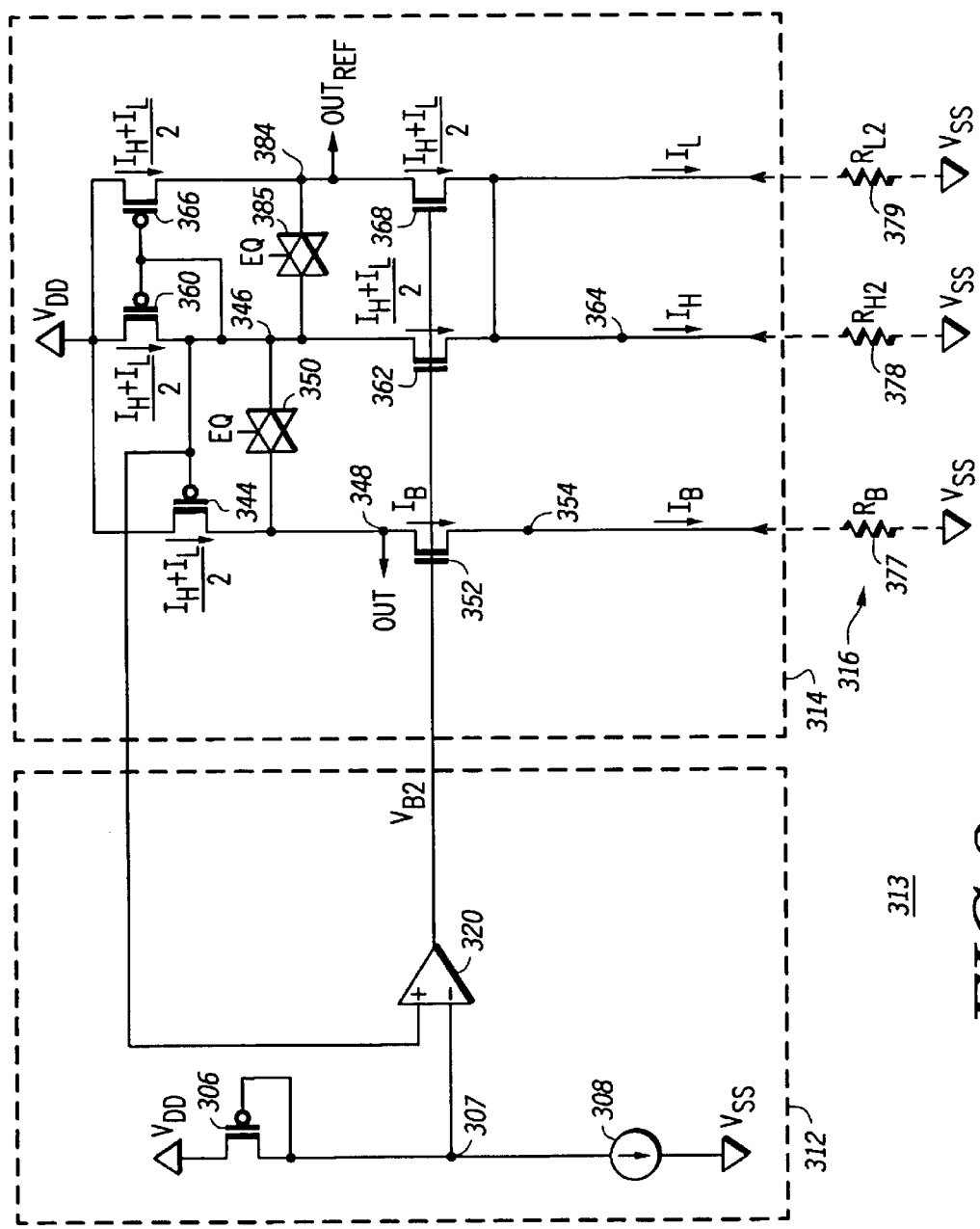
FIG. 3 is a schematic diagram of another embodiment of the bias circuit of FIG. 1.

Illustrated in FIG. 3 is another form of the control circuit 113 of FIG. 1. A control circuit 313 is provided having a sense amplifier 314, an array of bit cells 316 and bias circuit 312. Bias circuit 312 has a P-channel transistor 306 having a source connected to a $V_{DD}$ voltage terminal, and a gate and drain connected together at a node 307 to form a diode. A first terminal of a current source 308 is connected to node 307, and a second terminal of current source 308 is connected to the $V_{SS}$ voltage terminal. An operational amplifier 320 has a positive input, a negative input connected to node 307 and an output for providing a common gate bias voltage $V_{B2}$.

In the sense amplifier 314, a P-channel transistor 344 has a source connected to the $V_{DD}$ voltage terminal. A drain of transistor 344 is connected to a drain of an N-channel transistor 352 at an output node 348 which forms an output terminal labeled OUT. A gate of transistor 352 is connected to the $V_{B2}$ common gate bias voltage. A source of transistor 352 is connected to a node 354 and coupled via one or more coupling devices (not shown) to a first terminal of a bit resistance 377, $R_B$. A second terminal of bit resistance 377 is coupled via one or more coupling devices (not shown) to the $V_{SS}$ voltage terminal. A P-channel transistor 360 has a source connected to the $V_{DD}$ voltage terminal, and a gate connected to a drain thereof, to a gate of transistor 344 and to the positive (non-inverting) input of operational amplifier 320. A switch 350 has a first terminal connected to the drain of transistor 344 at node 348 and a second terminal connected to the drain of transistor 360 at node 346. Switch 350 is controlled by an Equalization control signal, EQ. A drain of an N-channel transistor 362 is connected to node 346. Transistor 362 has a gate connected to the $V_{B2}$ common gate bias voltage and has a source connected to a node 364. A first terminal of a high reference resistance 378, $R_{H2}$, is coupled via one or more coupling devices (not shown) to a node 364. A second terminal of resistance 378 is coupled via one or more coupling devices (not shown) to the $V_{SS}$ voltage terminal. A P-channel transistor 366 has a source connected to the $V_{DD}$ voltage terminal. A gate of transistor 366 is connected to the gate of transistor 360 at node 346. A drain of transistor 366 is connected to a node 384 that forms a reference output terminal, $OUT_{REF}$. A switch 385 has a first terminal connected to node 346 and a second terminal connected to the drain of transistor 366 at a node 384. A control terminal of switch 385 receives the equalization control signal, EQ. A drain of an N-channel transistor 368 is connected to node 384. Transistor 368 has a gate connected to the bias voltage, $V_{B2}$. A source of transistor 368 is connected to the source of transistor 362 at node 364 and is coupled via one or more coupling devices (not shown) to a first terminal of a low reference resistance 379, $R_{L2}$. A second terminal of resistance 379 is coupled via one or more coupling devices (not shown) to the $V_{SS}$ voltage terminal.

In operation, bias circuit 312 is implemented without the use of a mock sense amplifier and provides a single control signal, $V_{B2}$ to bias transistors 352, 362 and 368 of sense amplifier 314 to maintain a constant current through those transistors regardless of process, supply voltage and temperature variations. As a result, the precharge switches 180–182 of FIG. 1 are not implemented. A feedback signal from the drain of transistor 360 is connected to the noninverting or positive input of operational amplifier 320. A voltage is provided to the inverting input of operational amplifier 320 at node 307 resulting from the conduction of transistor 306 and current source 308. As current through the high resistance or low resistance memory bit cells, $R_{H2}$ and $R_{L2}$ respectively, starts to vary from any of several reasons, the current conducted will vary and influence the voltage at the drain of transistor 360. If the average current $[(I_H+I_L)/2]$ decreases, the voltage at the noninverting input of operational amplifier 320 increases relative to the voltage at node 307. In response, the $V_{B2}$ voltage increases which makes transistors 348, 362 and 368 conduct more, thereby increasing the current flow through transistors 344, 360 and 366. Therefore, the average current $(I_H+I_L)/2)$ is substantially the same as the reference current provided by current source 308.

Figure 4:
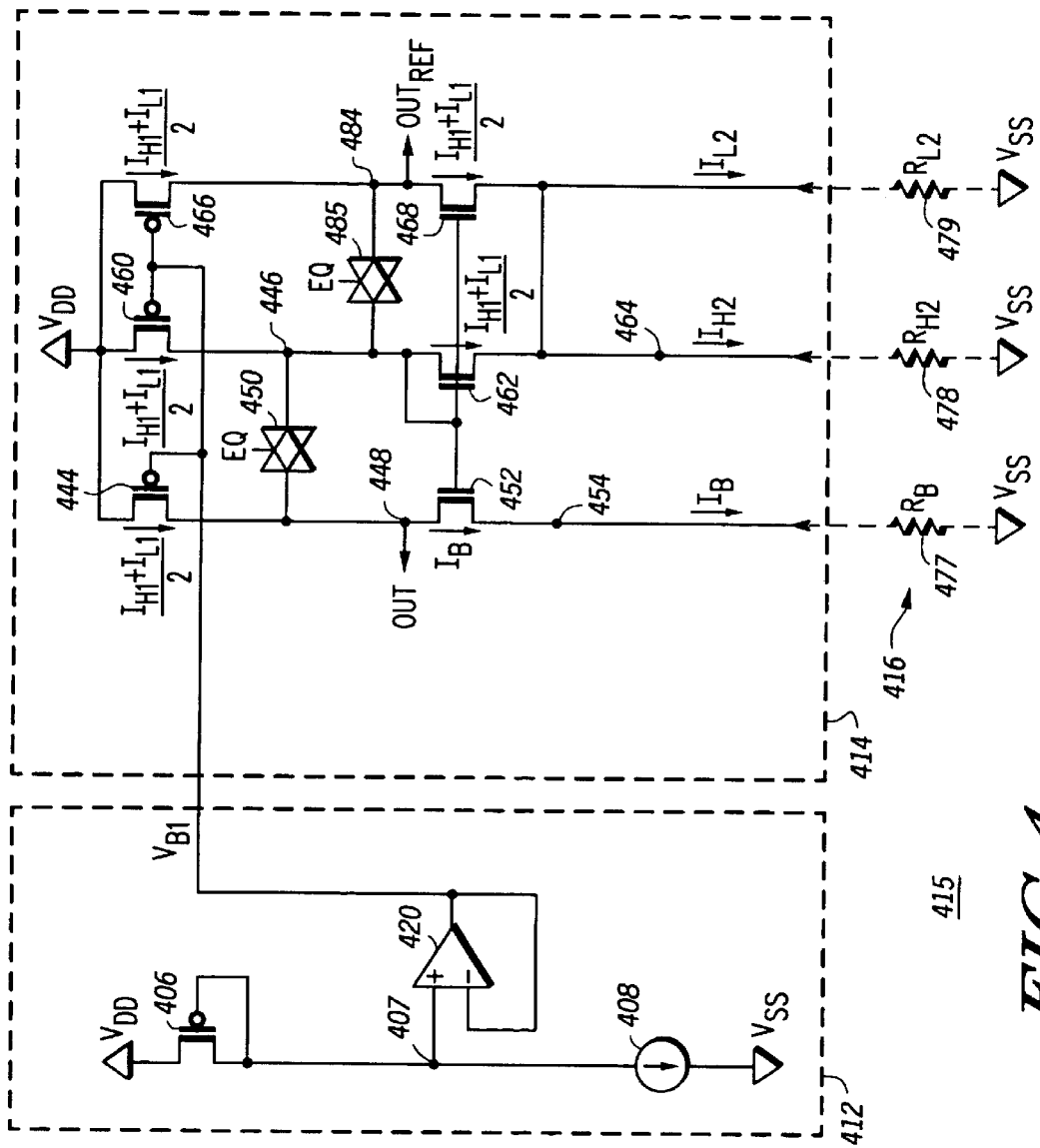
FIG. 4 is a schematic diagram of another embodiment of the bias circuit of FIG. 2.

Illustrated in FIG. 4 is another form of the bias circuit 212 of FIG. 2. A memory 415 is provided having a sense amplifier 414, an array of bit cells 416 and bias circuit 412. Within bias circuit 412, a P-channel transistor 406 has a source connected to a $V_{DD}$ voltage terminal. A gate of transistor 406 is connected to a drain thereof and to a node 407. A non-inverting (positive) input of an operational amplifier 420 is connected to node 407. A first terminal of a current source 408 is connected to node 407 and a second terminal of current source 408 is connected to a $V_{SS}$ voltage terminal. An inverting (negative) input of operational amplifier 420 is connected to an output thereof for providing the common gate bias voltage $V_{B1}$ In the sense amplifier 414, a P-channel transistor 444 has a source connected to the $V_{DD}$ voltage terminal and a gate connected to the output of operational amplifier 420 for receiving voltage $V_{B1}$. A drain of transistor 444 is connected to a drain of an N-channel transistor 452 at an output node 448 for providing an output signal, OUT. A gate of transistor 452 is connected to the gate of an N-channel transistor 462. A source of transistor 452 is connected to a node 454 and coupled via one or more coupling devices (not shown) to a first terminal of a bit resistance 477, $R_B$. A second terminal of bit resistance 477 is coupled via one or more coupling devices (not shown) to the $V_{SS}$ voltage terminal. A P-channel transistor 460 has a source connected to the $V_{DD}$ voltage terminal, a gate connected to the output of operational amplifier 420 for receiving $V_{B1}$, and a drain. A switch 450 has a first terminal connected to the drain of transistor 444 and a second terminal connected to the drain of transistor 460 at node 446. Switch 450 is controlled by an Equalization control signal, EQ. A drain of an N-channel transistor 462 is connected to node 446. Transistor 462 has a gate connected to its drain and has a source connected to a node 464. A first terminal of a high reference resistance 478, $R_{H2}$, is coupled via one or more coupling devices (not shown) to node 464. A second terminal of resistance 478 is coupled via one or more coupling devices (not shown) to the $V_{SS}$ voltage terminal. A P-channel transistor 466 has a source connected to the $V_{DD}$ voltage terminal. A gate of transistor 466 is connected to the gates of transistors 444 and 460 and to the output of operational amplifier 420 for receiving $V_{B1}$. A switch 485 has a first terminal connected to node 446 and a second terminal connected to the drain of transistor 466 at a node 484. A control terminal of switch 485 receives the equalization control signal, EQ. A drain of transistor 466 is connected to a node 484 that forms a reference output terminal, $OUT_{REF}$. A drain of an N-channel transistor 468 is connected to node 484. Transistor 468 has a gate connected to the gates of transistors 452 and 462. A source of transistor 468 is connected to the source of transistor 462 at a node 464 and is coupled via one or more coupling devices (not shown) to a first terminal of a low reference resistance 479, $R_{L2}$. A second terminal of resistance 479 is coupled via one or more coupling devices (not shown) to the $V_{SS}$ voltage terminal. Resistances 477–479 form the array portion 416. Within bias circuit 412, operational amplifier 420 is a unity gain buffer.

In operation, bias circuit 412 is implemented without the use of a mock sense amplifier and provides a single control signal, $V_{B1}$ to bias transistors 444, 460 and 466 of sense amplifier 414 to maintain a constant current through those transistors regardless of process, supply voltage and temperature variations. As a result, the precharge switches 280–282 of FIG. 2 are not implemented. A voltage is provided to the inverting input of operational amplifier 420 at node 407 resulting from the conduction of transistor 406 and current source 408. Operational amplifier 420 functions as a voltage follower circuit to buffer or maintain a voltage level at $V_{B1}$ equal to the voltage at node 407. Operational amplifier 420 is used as a buffer to have sufficient drive to overcome the detrimental effect of coupling parasitics. Depending upon the desired application, the control circuit 412 may be implemented without the use of operational amplifier 420 and apply node 407 directly as voltage $V_{B1}$. Assuming that transistors 406, 444, 460 and 466 are matched to have substantially the same threshold voltage and given that voltage $V_{B1}$ is maintained substantially the same voltage as node 407, the average current $[(I_{H1}+I_{L1})/2]$ conducted by transistors 444, 460 and 466 is substantially the same as the reference current provided by current source 308. Therefore, the current applied across resistances 477–479 is independent of the resistance values.

By now it should be apparent that a control circuit for MRAM sense amplifiers has been provided that allows critical transistors in a sense amplifier to maintain a consistent level of matching in response to process, supply voltage and temperature variations. One of the main process variations which impacts the matching is variation in the nominal bit cell resistance. For memories such as MRAM that utilize a tunnel junction bit cell structure, this resistance variation can vary by a ratio as high as two-to-one over processing. With an ideal signal providing a current-differential of approximately fifteen percent, as little as two percent mismatch in current mirrors can have significant detrimental impact on the accuracy of an MRAM sense amplifier. It should be noted that bit cell current variation for sense amplifiers using the bias circuits disclosed herein remains susceptible to variations in the current of current references 108, 208, 308 and 408. However, this source of variation has much less impact on sense amplifier reliability than that of the variation in bit cell resistance commonly caused by process, supply voltage and temperature variation.

Various changes and modifications to the embodiments herein chosen for purposes of illustration will readily occur to those skilled in the art. These sense amplifier and gain stage improvements are applicable to other memory types whose state is manifested as a change in the impedance of the bit. Although an MRAM is discussed for some applications, it should be apparent that other types of memory cells may utilize the features disclosed herein. Variations in the types of conductivities of transistors, the types of transistors, etc. may be readily made. While the bias circuits maintain current through the bit cells at a value proportional to the reference current over variations in average bit cell resistance with immunity to variations in process, supply voltage and temperature, the current value does not necessarily have to be constant. For example, the current may be regulated to change to predetermined levels or values proportional to the current reference depending upon circuit parameters and conditions. To the extent that such modifications and variations do not depart from the spirit of the invention, they are intended to be included within the scope thereof that is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A sense amplifier bias circuit for a memory having a sense amplifier and an array of bit cells, each of the bit cells having at least two distinct resistance states, comprising:

a mock sense amplifier and mock array of bit cells that when biased establishes internal steady state voltages equivalent to a steady state condition of the sense amplifier with equalized outputs;

a current reference for providing a reference current; and control circuitry coupled to the current reference, the mock sense amplifier and mock array of bit cells, the control circuitry biasing the mock sense amplifier and mock array of bit cells to maintain current through the bit cells in the mock array of bit cells at a value proportional to the reference current over variations in average bit cell resistance.

2. The sense amplifier bias circuit of claim 1 wherein the control circuitry further comprises:

a diode-connected transistor that matches one or more transistors in the mock sense amplifier to create a varying voltage that when used to bias one of the one or more transistors in the mock sense amplifier functions to maintain a current proportional to the reference current through the bit cells in the mock array of bit cells.

3. The sense amplifier bias circuit of claim 2 wherein the diode-connected transistor further matches one or more transistors in the sense amplifier.

4. The sense amplifier bias circuit of claim 2 wherein the control circuitry further comprises:

an operational amplifier having a first input connected to the diode-connected transistor for receiving the varying voltage, a second input connected to the mock sense amplifier for receiving a comparison voltage established within the mock sense amplifier to track the varying voltage, and an output for providing an output bias voltage for biasing the sense amplifier.

5. The sense amplifier bias circuit of claim 1 wherein the control circuitry further comprises:

a first transistor of a first conductivity type having a first current electrode connected to a first supply voltage terminal, and a second current electrode and a control electrode connected together; and an operational amplifier having a first input connected to the second current electrode of the first transistor, a second input and an output; and the mock sense amplifier comprises:

a second transistor of the first conductivity type having a first current electrode connected to the first supply voltage terminal, and a second current electrode and a control electrode connected together and to the second input of the operational amplifier;

a third transistor of a second conductivity type having a first current electrode connected to the second current electrode of the second transistor, a control electrode connected to the output of the operational amplifier, and a second current electrode;

a fourth transistor of the first conductivity type having a first current electrode connected to the first supply voltage terminal, and a second current electrode and a control electrode connected together and to the second input of the operational amplifier;

a fifth transistor of the second conductivity type having a first current electrode connected to the second current electrode of the fourth transistor, a control electrode connected to the output of the operational amplifier, and a second current electrode; and the mock array of bit cells comprise:

a first bit cell coupled between the second current electrode of the third transistor and a second supply voltage terminal, the first bit cell being programmed in a high resistance value; and a second bit cell coupled between the second current electrode of the fifth transistor and the second supply voltage terminal, the second bit cell being programmed in a low resistance value.

6. The sense amplifier bias circuit of claim 1 wherein the control circuitry further comprises:

a first transistor of a first conductivity type having a first current electrode connected to a first supply voltage terminal, and a second current electrode and a control electrode connected together; and an operational amplifier having a first input connected to the second current electrode of the first transistor, and a second input and an output connected together; and the mock sense amplifier comprises:

a second transistor of the first conductivity type having a first current electrode connected to the first supply voltage terminal, a control electrode connected to the output of the operational amplifier, and a second current electrode;

a third transistor of a second conductivity type having a first current electrode connected to the second current electrode of the second transistor and to a control electrode thereof and having a second current electrode;

a fourth transistor of the first conductivity type having a first current electrode connected to the first supply voltage terminal, a control electrode connected to the output of the operational amplifier, and a second current electrode;

a fifth transistor of the second conductivity type having a first current electrode connected to both the second current electrode of the fourth transistor and the first current electrode of the third transistor, a control electrode connected to the control electrode of the third transistor, and a second current electrode; and the mock array of bit cells comprise:

a first bit cell coupled between the second current electrode of the third transistor and a second supply voltage terminal, the first bit cell being programmed in a high resistance value; and a second bit cell coupled between the second current electrode of the fifth transistor and the second supply voltage terminal, the second bit cell being programmed in a low resistance value.

7. A sense amplifier bias circuit for a memory having a sense amplifier and an array of bit cells, each of the bit cells having at least two distinct resistance states, comprising:

a current reference for providing a reference current; and control circuitry coupled to the current reference and the sense amplifier, the control circuitry using a diode-connected transistor that matches a transistor in the sense amplifier to create a varying bias voltage, the varying bias voltage maintaining current through a plurality of bit cells in an array of bit cells at a value proportional to the reference current over variations in average bit cell resistance.

8. The sense amplifier bias circuit of claim 7 wherein the control circuitry further comprises:

an operational amplifier coupled to the current reference and to the sense amplifier, the operational amplifier providing the varying bias voltage by using either a current or a voltage established within the sense amplifier during operation as feedback to control how the varying bias voltage is varied.

9. A sense amplifier bias circuit for a memory having a sense amplifier and an array of bit cells, each of the bit cells having at least two distinct resistance states, comprising:

means for simulating circuit conditions in the sense amplifier and array of bit cells so that when the means for simulating circuit conditions are biased, the means for simulating circuit conditions establishes internal steady state voltages equivalent to a steady state condition of the sense amplifier with equalized outputs;

current reference means for providing a reference current; and control means coupled to the current reference means and the means for simulating circuit conditions, the control means biasing the means for simulating circuit conditions to maintain current through the array of bit cells at a value proportional to the reference current over variations in average bit cell resistance.

10. The sense amplifier bias circuit of claim 9 wherein the control means further comprise a diode-connected transistor for establishing a varying bias voltage for use by the sense amplifier to maintain current through the array of bit cells at the value that is proportional to the reference current.

11. A memory having a sense amplifier bias circuit, the memory comprising:

a first transistor that is connected to a power supply voltage terminal and is diode-connected by having a control electrode connected to a current electrode thereof;

a current source connected in series with the first transistor between the first transistor and a reference terrninal, the current source providing a reference current;

an operational amplifier having a first input connected to the current source and first transistor, a second input, and an output;

a sense amplifier having a second transistor that is diode-connected and which establishes a voltage or current that is used as a feedback signal that is connected to the second input of the operational amplifier, the sense amplifier being biased by a variable bias voltage provided by the output of the operational amplifier; and an array of memory bit cells coupled to the sense amplifier, the variable bias voltage maintaining current through the array of memory bit cells at a value proportional to the reference current over variations in average bit cell resistance.

12. The memory of claim 11 wherein the array of memory bit cells further comprise:

bit cells, each having at least two distinct resistance states to indicate how each is programmed.

13. The memory of claim 11 wherein the memory is a magnetoresistive random access memory (MRAM).

14. A memory having a sense amplifier bias circuit, the memory comprising:
   a first transistor that is connected to a power supply voltage terminal and is diode-connected by having a control electrode connected to a current electrode thereof;
   a current source connected in series with the first transistor between the first transistor and a reference terminal, the current source providing a reference current;
   an operational amplifier having a first input connected to the current source and first transistor, a second input, and an output;
   a sense amplifier having a second transistor with a control electrode coupled to the output of the operational amplifier, the second transistor establishing a bias current in the sense amplifier that is proportional to the reference current; and
   an array of memory bit cells coupled to the sense amplifier.

15. The memory of claim 14 wherein the array of memory bit cells further comprise:
   bit cells, each having at least two distinct resistance states to indicate how each is programmed.

16. The memory of claim 14 wherein the memory is a magnetoresistive random access memory (MRAM).

* * * * *